(12) United States Patent  
Hofer et al.

(10) Patent No.: US 8,030,685 B2
(45) Date of Patent: Oct. 4, 2011

(54) DETECTOR SYSTEM AND DETECTOR SUBASSEMBLY

(75) Inventors: Thomas Hofer, Lappersdorf (DE); Werner Kuhlmann, Munich (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 107 days.

(21) Appl. No.: 12/064,759

(22) PCT Filed: Aug. 17, 2006

(86) PCT No.: PCT/DE2006/001448
§ 371 (c)(1),
(2), (4) Date: Jun. 5, 2008

(87) PCT Pub. No.: WO2007/036187
PCT Pub. Date: Apr. 5, 2007

(65) Prior Publication Data
US 2008/0246105 A1    Oct. 9, 2008

(30) Foreign Application Priority Data

Sep. 30, 2005 (DE) .......... 10 2005 047 136
Dec. 21, 2005 (DE) .......... 10 2005 061 206

(51) Int. Cl.
*H01L 31/102* (2006.01)
(52) U.S. Cl. .......... 257/189; 257/80
(58) Field of Classification Search .......... 257/80, 257/189
See application file for complete search history.

(56) References Cited

U.S. PATENT DOCUMENTS 6,476,374 B1 * 11/2002 Kozlowski et al. ........ 250/214.1
7,391,005 B2 * 6/2008 Sherazi et al. ............ 250/214 R
2004/0212083 A1 10/2004 Yang
2005/0163016 A1 7/2005 Kimura

FOREIGN PATENT DOCUMENTS

| DE | 197 20 300 A1 | 5/1997 |
| DE | 10 2004 054 079 A1 | 6/2005 |
| DE | 10 2004 037 020 A1 | 8/2005 |
| DE | 102004037020 | 8/2005 |
| EP | 1 130 647 A3 | 8/2007 |

* cited by examiner

*Primary Examiner* — Douglas Menz
(74) *Attorney, Agent, or Firm* — Fish & Richardson P.C.

(57) ABSTRACT

A detector system with a microelectronic semiconductor chip and a separate optoelectronic detector chip is specified, wherein the detector chip is positioned on the semiconductor chip. A detector subassembly with such a detector system is also specified.

21 Claims, 4 Drawing Sheets

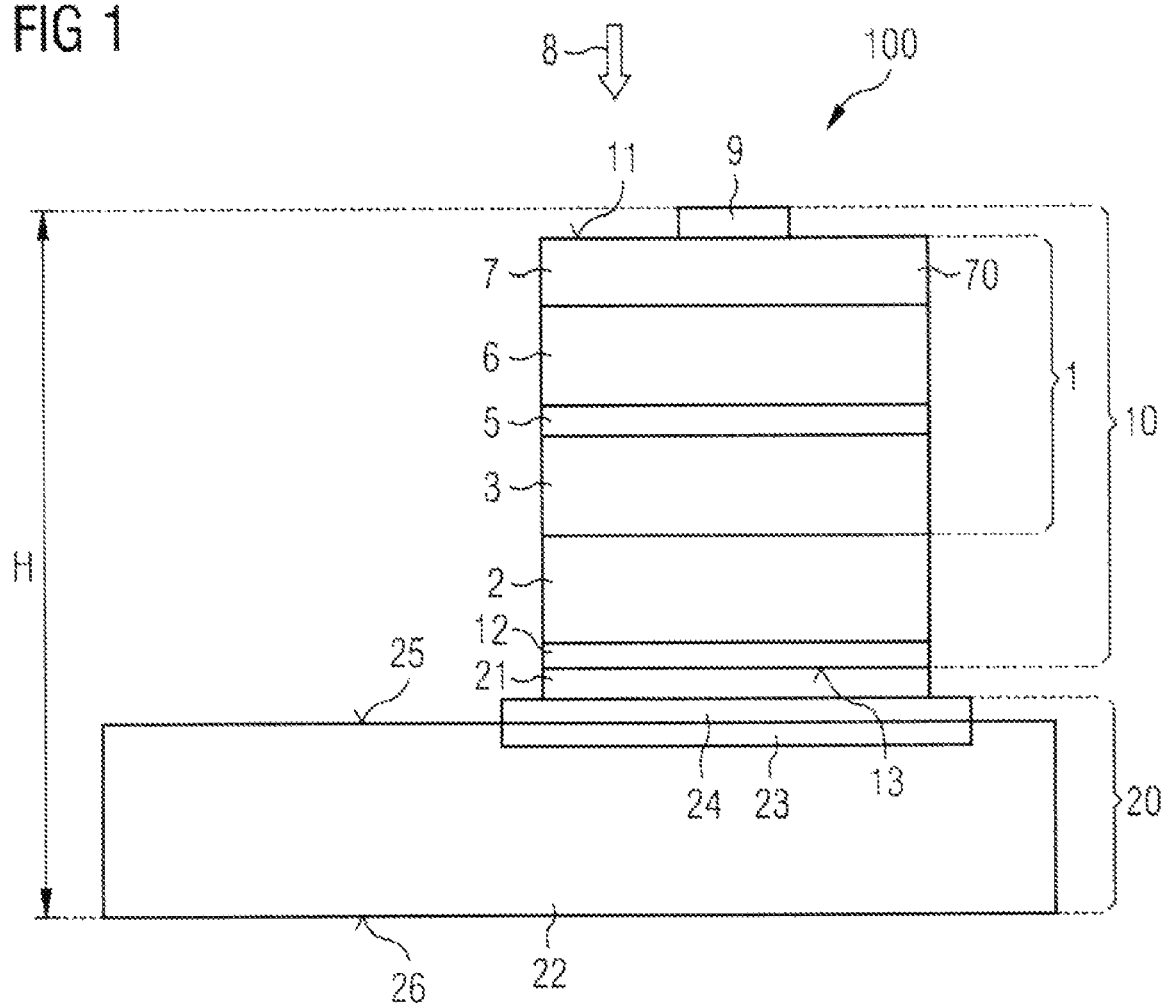

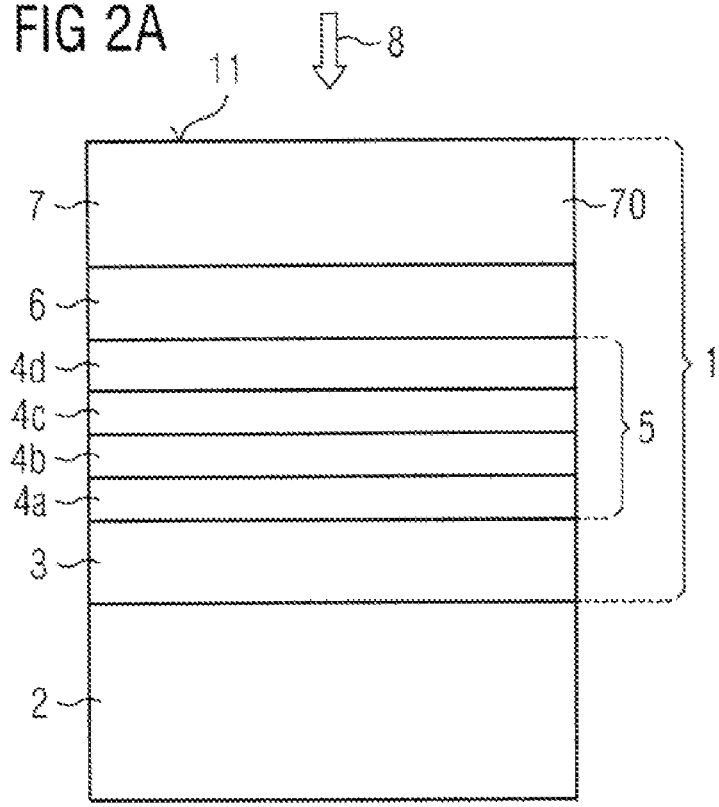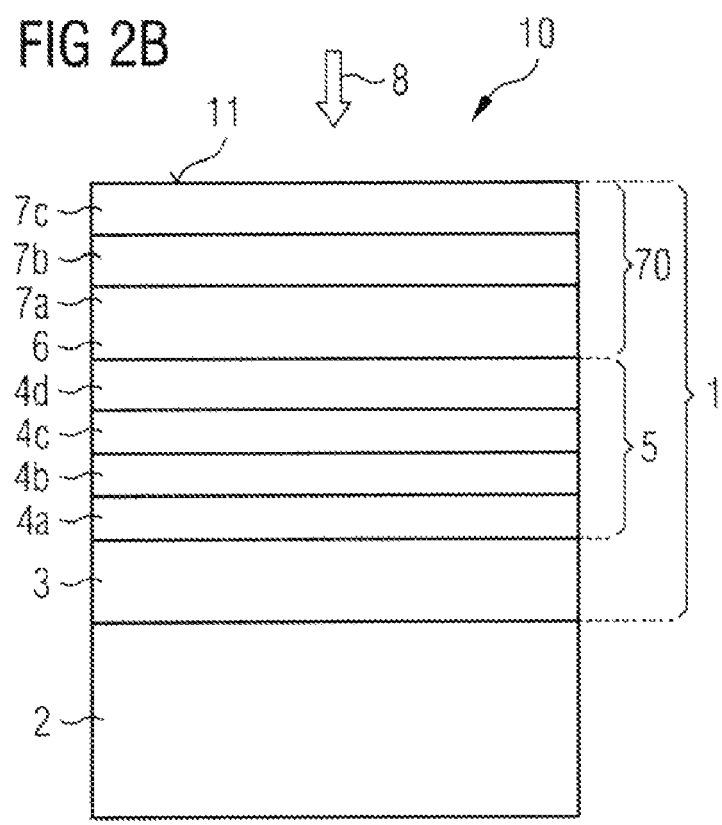

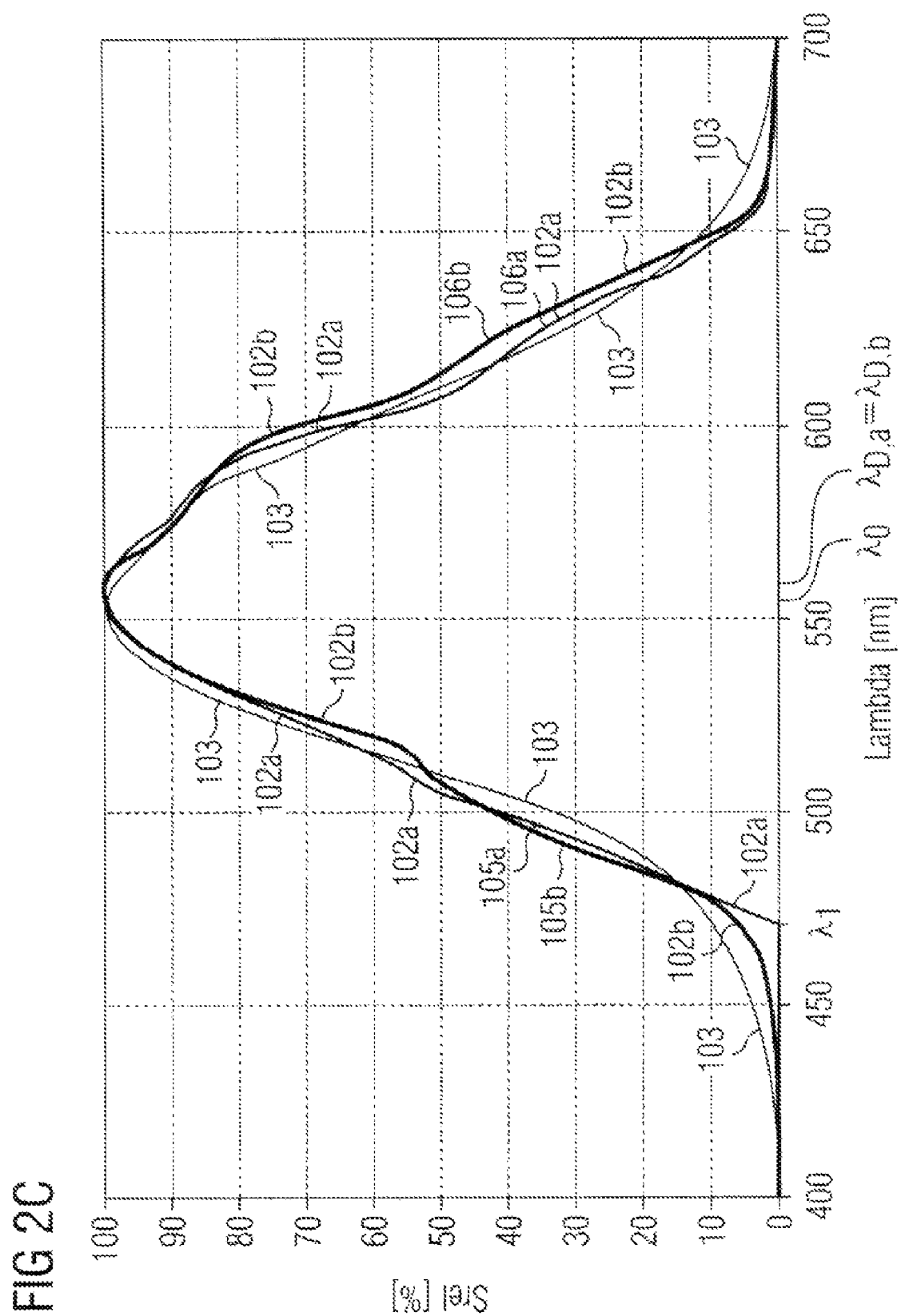

DETECTOR SYSTEM AND DETECTOR SUBASSEMBLY

CROSS-REFERENCE TO RELATED APPLICATIONS

This application is the National Stage of International Application No. PCT/DE2006/001448, filed on Aug. 17, 2006, which claims the priority to German Patent Applications Serial No. 10 2005 047 136.6, filed on Sep. 30, 2005 and Serial No. 10 2005 061 206.7, filed on Dec. 21, 2005. The contents of all applications are hereby incorporated by reference in their entireties.

BACKGROUND

This invention relates to a detector system with an easily realizable detector chip and a detector subassembly with such a detector system.

SUMMARY

It is one objective of this invention to describe a practical detector system with reduced space requirement, especially with reduced mounting area. A detector subassembly with a low space requirement, especially a small mounting area, is also to be described.

A detector system pursuant to the invention comprises an optoelectronic detector chip, particularly a semiconductor-based detector chip. The detector system also preferably comprises a separate microelectronic semiconductor chip. The detector chip is also preferably located on the semiconductor chip. It is especially preferred for the detector chip to be connected to the semiconductor chip.

The detector chip is preferably designed as a radiation detector chip to detect radiation, especially visible radiation, striking the detector chip that can generate a detector signal in the detector chip. The semiconductor chip is preferably designed to process a detector signal generated in the detector chip, for example to amplify this signal.

In a special embodiment, the detector system comprises a microelectronic semiconductor chip and a separate optoelectronic detector chip, with the detector chip located on the semiconductor chip.

The space requirement of the detector system is advantageously reduced in the lateral direction by the placement of the detector chip on the microelectronic semiconductor chip, compared with a side-by-side arrangement of the two chips and laterally spaced apart from one another as on a carrier. The area needed to mount the two chips on the carrier element can thus be reduced compared with a spaced arrangement.

An electrically conducting connection that is preferably made between the detector chip and the semiconductor chip can also be accomplished over an advantageously short path because of the placement of the two chips relatively close to one another and against one another. A signal generated in the detector chip can thus be fed to the semiconductor chip for processing over an advantageously short path. No lengthy bond wire, with a length of perhaps several times 100 μm, is needed for this purpose.

A relatively long electrically conducting link between the detector chip and the semiconductor chip increases the risk of electromagnetic interference with the signal generated in the detector chip during the feed of this signal to the semiconductor chip. The risk of a signal that is already considerably perturbed being supplied to the semiconductor chip for processing, and thus the risk that a perturbed output signal from the semiconductor chip that may be detected on an output of the semiconductor chip that preferably shows it, is thus reduced.

This is of particular importance if the semiconductor chip is made as an amplifier, preferably with a logarithmic amplification circuit, for example, integrated in the semiconductor chip. The signal generated in a detector chip is often relatively small, for example a photocurrent of the order of nA, so that amplification of this signal is often needed for further use of the detector signal. However, if a signal that is already considerably perturbed is supplied to the semiconductor chip for processing, the perturbations are amplified along with the detector signal. The risk of such interference can be reduced by the superimposed arrangement of the detector chip and the semiconductor chip, and the detector system can be designed with an advantageously small susceptibility to external electromagnetic interference coupled into the system.

The semiconductor chip and the detector chip are designed in particular as discrete chips. Compared with a monolithically integrated embodiment of a microelectronic semiconductor element and an optoelectronic detector element, the individual chips can simply be manufactured separately with a discrete embodiment, and can be optimized for their particular functions.

The microelectronic semiconductor chip, which has an integrated circuit (IC chip), for example, is preferably based on an elemental semiconductor material, preferably in particular on silicon. Silicon is particularly suitable for making a microelectronic chip with an integrated circuit (IC chip), especially including an amplifier circuit.

A III-V compound semiconductor material or III-V semiconductor materials is/are especially suitable for a detector chip, particularly for radiation detection. The detector chip therefore preferably contains or is based on a compound semiconductor material or on compound semiconductor materials. III-V compound semiconductor materials are distinguished by simply attainable high quantum efficiencies in the conversion of radiation into a detector signal in an active region of the detector chip serving to generate the detector signal by absorption of radiation in this active region.

In a preferred embodiment, the detector chip is placed above an electrically conducting connecting layer between the semiconductor chip and the detector chip, and in particular is directly connected with electrical conduction to the semiconductor chip.

By making a layered electrically conducting connection between the detector chip and the semiconductor chip, the electrical link between the semiconductor chip and the detector chip can advantageously and simply be shortened compared with a different electrically conducting connection, such as a bond wire. The risk of coupling electromagnetic interference into the detector system can be reduced in this way.

The detector chip is preferably connected to the semiconductor chip, especially to an input of the semiconductor chip, with electrical conduction. The detector chip can be placed at the input of the semiconductor chip, with the electrically conducting connection occurring with particular advantage through the connecting layer. The detector signal is expediently fed to the semiconductor chip for processing through the input of the semiconductor chip.

In another preferred embodiment, a face of the detector chip facing away from the semiconductor chip is provided to ground the detector chip, especially by means of a bond wire. To this end, a contact can be placed on the face of the detector chip facing away from the semiconductor chip for grounding, for example by connecting the contact to a bond wire. The input of the semiconductor chip that is positioned at the face of the detector chip facing away from the grounded face, can thus be efficiently shielded from the coupling of electromagnetic interference into the detector system.

The detector chip is also preferably designed as a diode chip. A diode chip is especially suitable as a radiation detector.

In another preferred embodiment, the detector chip is fastened to the semiconductor chip. To this end, the detector chip is preferably connected to the semiconductor chip by means of a layer for adhesion, for example an adhesive layer. It is especially beneficial for the adhesive layer to be electrically conducting, in particular an electrically conducting connecting layer at the same time. An electrically conducting adhesive layer, such as a silver conducting adhesive layer, is especially suitable for this.

The thickness of the connecting layer is preferably less than or equal to 15 µm, and with special preference less than or equal to 10 µm. The thickness of the connecting layer is preferably greater than or equal to 3 µm, and with special preference greater than or equal to 5 µm. Such layer thicknesses, particularly between 5 µm and 10 µm inclusive, are especially suitable for a reliable electrically conducting connection and at the same time for a reliable fastening of the detector chip to the semiconductor chip through the adhesion-promoting connecting layer, and also with regard to the reduced risk of electromagnetic interference being coupled into the detector signal.

In another preferred embodiment, a surface of the semiconductor chip facing the detector chip is larger than a surface of the detector chip facing the semiconductor chip. This can simplify the placement of the detector chip on the surface of the semiconductor chip.

In another preferred embodiment, a surface of the semiconductor chip facing away from the detector chip is provided as the mounting area for mounting the detector system on a carrier element. The mounting area preferably faces the carrier element for this purpose. Because of the superimposed arrangement of detector chip and semiconductor chip, the mounting area is advantageously determined essentially only by the surface of the semiconductor chip facing away from the detector chip. This facilitates a beneficially space-saving mounting of the detector system.

The height of the detector system is also preferably smaller than or equal to 500 µm, and with special preference smaller than or equal to 400 µm. This achieves a small structural height of the detector system. For example, the semiconductor chip may have a height of 200 µm or less, and/or the detector chip may have a height of 200 µm or less.

In another preferred embodiment, the detector chip has a spectral sensitivity distribution that is shaped according to a prescribed sensitivity distribution.

The spectral sensitivity distribution of the detector chip is imparted by the dependence of the signal generated in the detector chip, such as the photocurrent or variables dependent on it, on the wavelength of the radiation incident upon the detector chip.

The spectral sensitivity distribution of the detector chip and thereby that of the detector system can be selectively shaped by the design of the detector chip. It is preferred for the detector chip to be designed so that the signal generated in the detector chip varies according to the prescribed sensitivity distribution.

If the semiconductor chip is designed as an amplifier, then after the amplification of the signal from the detector chip, the basic signal form of the signal of the detector chip shaped, for example, according to a prescribed spectral sensitivity distribution, preferably leaves the semiconductor chip essentially unchanged. Therefore no costly re-correction is necessary, after passing through the amplifier, of a detector signal already attuned to a prescribed spectral sensitivity distribution before entering the amplifier, but changed in the amplifier.

The prescribed spectral sensitivity distribution preferably has a maximum at a given wavelength $\lambda_0$. The prescribed spectral sensitivity distribution in particular can be determined by that of the human eye. Its maximum for a brightness-adapted human eye is at approximately 555 nm.

The detector system is preferably intended for use as an ambient light sensor. The detector system, because the detector signal can be amplified in the semiconductor chip, provides an advantageously high output signal that shows an advantageously low susceptibility to electromagnetic interference with a superimposed arrangement of the semiconductor chip and the detector chip. As an ambient light sensor, the detector system is especially suitable for controlling illumination devices such as the backlighting of displays, such as the display of a mobile telephone or of an indicator device in a vehicle, such as an instrument panel.

In another preferred embodiment, an active region provided to generate the detector signal can have a plurality of functional layers with different band gaps and/or thicknesses. Preferably, at least one of the functional layers absorbs radiation in a wavelength range with wavelengths greater than $\lambda_0$. For this purpose, the wavelength corresponding to the band gap of this functional layer is preferably greater than $\lambda_0$. The sensitivity of the detector chip can be easily shaped according to the prescribed spectral sensitivity distribution by such a design of the active region.

For wavelength ranges in which the prescribed spectral sensitivity distribution assumes relatively high values, the functional layers are preferably made with appropriate thickness, so that correspondingly high radiation power is absorbed in this wavelength range. Accordingly, more electron-hole pairs can be generated in the particular functional layers, which can lead to an increased signal from the detector chip in this wavelength range. For wavelength ranges with lower values of the prescribed spectral sensitivity distribution, the corresponding functional layers are preferably made correspondingly thin. The responsiveness of the detector chip (the generated signal strength versus the radiant intensity incident on the detector) can be selectively controlled in the wavelength range associated with the particular functional layer by the thickness of the particular functional layer. The spectral sensitivity distribution of the detector chip can be matched easily to the prescribed spectral sensitivity distribution by the ratio of the thicknesses of the functional layers to one another. In particular, the detector sensitivity can be matched to the prescribed sensitivity distribution for wavelengths greater than $\lambda_0$ by the design of the active region. Preferably at least one functional layer has a band gap in the range around the wavelength $\lambda_0$, so that a relatively high detector signal is generated in the range around the maximum of the prescribed sensitivity distribution.

The active region is preferably integrated in a semiconductor body of the detector chip. It is especially preferred for the active region to be made between two layers with different conduction types (p- or n-conductive). The functional layers are preferably of intrinsic design, i.e. undoped, and with special preference they are placed between the layers of different conduction types.

A filter layer structure with at least one filter layer can be placed between the active region and a radiation input surface of the detector chip that is preferably composed of the surface of the semiconductor body of the detector chip facing away from the semiconductor chip. The filter layer structure is preferably monolithic and integrated in the semiconductor body of the detector chip. The filter layer preferably absorbs radiation in a wavelength range that comprises wavelengths smaller than $\lambda_0$. Radiant power absorbed in the filter layer structure does not reach the active region, so that only a correspondingly reduced signal is generated in the filtered wavelength range. The filter layer structure is expediently placed outside of the active region. The sensitivity of the detector chip to wavelengths smaller than the wavelength $\lambda_0$ of the maximum of the prescribed spectral sensitivity distribution can be shaped by means of the filter layer structure. Moreover, a band gap—direct or indirect—of the filter layer preferably corresponds to a wavelength smaller than $\lambda_0$.

If the filter layer structure has a plurality of filter layers, then they are preferably made with different band gaps and/or thicknesses. Matching the detector sensitivity to the prescribed spectral sensitivity distribution can be simplified in this way.

Because the filter layer structure can be integrated monolithically into the semiconductor body and because of the design of the active region, external filters, filters located outside of the semiconductor body, are unnecessary for matching the sensitivity of the detector chip to a prescribed sensitivity. The semiconductor body in particular can be grown epitaxially with a spectral sensitivity distribution according to the prescribed sensitivity distribution.

III-V compound semiconductor materials, preferably materials from the material systems $In_xGa_yAl_{1-x-y}P$, with $0 \leq x \leq 1$, $0 \leq y \leq 1$, and $x+y \leq 1$, preferably $x \neq 0$ and/or $y \neq 0$, and/or $In_xGa_yAl_{1-x-y}As$, with $0 \leq x \leq 1$, $0 \leq y \leq 1$, and $x+y \leq 1$, preferably $x \neq 0$ and/or $y \neq 0$, are particularly suitable for a detector chip, especially for detection according to the prescribed sensitivity distribution of the human eye. Particularly high internal quantum efficiencies can be produced by signal generation in the active region in the visible range by means of III-V compound semiconductor materials.

The material system $In_xGa_yAl_{1-x-y}P$ is particularly suitable for making the active region, especially the functional layers. Materials from the $In_xGa_yAl_{1-x-y}As$ systems with $0 \leq x \leq 1$ preferably $x > 0$, or the $In_xGa_yAl_{1-x-y}P$ systems, are particularly suitable for the filter layers. If the semiconductor body contains elements based on $Al_xGa_{1-x}As$, then elements of the semiconductor body based on $In_xGa_yAl_{1-x-y}P$ are preferably chosen at least in part from the material subsystem $In_{0.5}(Ga_{1-x}Al_x)_{0.5}P$, with $0 \leq x \leq 1$, preferably $x > 0$. $Al_xGa_{1-x}As$ and $In_{0.5}(Ga_{1-x}Al_x)_{0.5}P$ are well lattice-matched with one another and also with GaAs, which can be used, for example, as the growth substrate for the semiconductor body.

Photodiode chips based on Si, on the other hand, show relatively low spectral sensitivity in the visible spectral range and are sensitive far into the infrared, so that for radiation detection somewhat according to eye sensitivity, the sensitivity of the Si photodiode chip in the long-wavelength range often has to be matched further to the prescribed sensitivity by costly external filtering.

Therefore, for an ambient light sensor according to the spectral sensitivity distribution of the human eye, a detector chip based on Si whose sensitivity distribution is aligned to that of the human eye by one or more suitable external filters may also be suitable. Since Si photodiode chips with no preceding filter usually show their greatest sensitivity in the infrared spectral range, however, a detector chip based on III-V semiconductor material is particularly suitable for efficient radiation detection in the visible spectral range and in particular also for an ambient light detector.

A detector subassembly pursuant to the invention comprises a detector system pursuant to the invention mounted on a carrier element. It is preferred for the semiconductor chip to be positioned between the detector chip and the carrier element.

Because of the superimposed arrangement of the detector chip and the microelectronic semiconductor chip, the subassembly can be realized with an advantageously small structural size. In particular, structural sizes can be realized that are feasible as a rule only for monolithically integrated methods.

It is preferred for the detector system to be embedded in a shell transparent to radiation. The shell can be of clear design. In particular, filter particles to match the spectral sensitivity distribution of the detector system can be avoided because the sensitivity of the detector chip is easily matched to a prescribed spectral sensitivity distribution.

In another preferred embodiment, the detector subassembly has a plurality of external electrical connections, preferably three or more, that are provided for the external electrical contacting of the detector system.

In another preferred embodiment, the detector subassembly is surface-mountable (SMD: surface mountable device). The surface-mounting technique facilitates the space-saving mounting of the detector subassembly on an external circuit element, such as a printed circuit board.

Other features, benefits, and utility of the invention are found in the following description of the examples of embodiment in combination with the figures.

BRIEF DESCRIPTION OF THE DRAWINGS

FIG. 1 shows a schematic cross-sectional view of an example of embodiment of a detector system, FIG. 2 shows two examples of embodiment of a detector chip in FIGS. 2A and 2B with reference to schematic cross-sectional views, and quantitatively in FIG. 2C the curve of the spectral sensitivity distributions of the two detector chips and the curve of the spectral sensitivity distribution of the brightness-adapted human eye.

Identical and equivalent elements and elements with the same effect are given the same reference symbols in the figures.

DETAILED DESCRIPTION

Figure 3A:
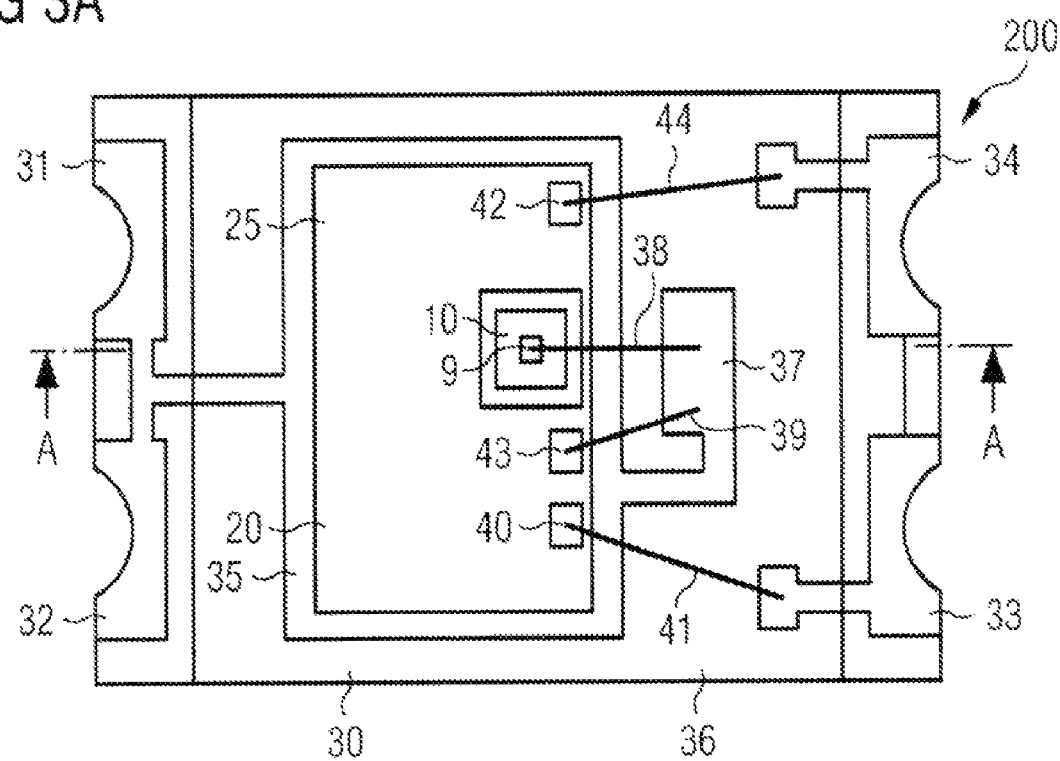
FIG. 3 shows a schematic top view of an example of embodiment of a detector element in FIG. 3A, and in FIG. 3B a schematic cross-sectional view of the detector subassembly along the line A-A in FIG. 3A.

FIG. 1 shows a schematic cross-sectional view of an example of embodiment of a detector system.

The detector system 100 comprises an optoelectronic detector chip 10 for radiation detection and a separate microelectronic semiconductor chip 20. The detector chip 10 is placed on the semiconductor chip 20 and is connected to the semiconductor chip through a connecting layer 21 positioned between the semiconductor chip and the detector chip.

The detector chip 10 comprises a semiconductor body 1 that can be placed on a carrier 2. The semiconductor body 1 is preferably monolithically integrated, perhaps grown epitaxially. The carrier 2 can comprise the growth substrate on which a semiconductor layer sequence is grown epitaxially for the semiconductor body 1, or can be composed of it.

The detector chip 10 also has an active region 5 suitable for generating a detector signal that is produced between a first semiconductor layer 3 and a second semiconductor layer 6, which preferably have different types of conduction (p-conduction or n-conduction). The active region 5 is preferably intrinsic, i.e. undoped. A filter layer structure 70 with a filter layer 7 is positioned between a radiation input surface 11 of the detector chip 10, particularly a surface facing away from the semiconductor chip 20, that is provided for the entry of radiation into the detector chip, and the active region 5. These elements of the detector chip 10 are preferably integrated monolithically in the semiconductor body 1. The radiation input surface 11 is preferably composed of at least a subregion of the surface of the semiconductor body 1 facing away from the semiconductor chip 20.

The active region 5 and/or the filter layer 7 preferably contain or are based on a III-V compound semiconductor material. An active region with high internal quantum efficiency can readily by developed by means of III-V compound semiconductor materials. A radiation fraction from radiation 8 incident upon the detector chip 10 absorbed in the active region 5 thus leads with high probability to an electron-hole pair contributing to the signal of the detector chip 10. III-V compound semiconductor materials, particularly materials from the material system $In_xGa_yAl_{1-x-y}P$, are especially suitable for an active region 5 for the detection of visible radiation.

The filter layer 7 can absorb portions of the radiation 8. Since the filter layer 7 is located between the active region 5 and the radiation input surface 11, the radiation fractions that are absorbed in the filter layer 7 contribute only to a correspondingly reduced extent to the signal from the detector chip 10. The spectral sensitivity distribution of the detector chip 10—the dependence of the signal generated in the detector chip on the wavelength of the incident radiation—can be shaped simply according to a prescribed spectral sensitivity distribution, for example that of the human eye, by means of the filter layer structure.

The spectral sensitivity distribution of the detector chip 10 can also be matched to the prescribed spectral sensitivity distribution by the formation of the active region 5. For this purpose, the active region 5 preferably comprises a plurality of functional layer with different band gaps and/or thicknesses. These functional layers can absorb radiation fractions from the incident radiation. The electron-hole pairs generated by the absorption contribute to the signal of the radiation detector, and the curve of the spectral sensitivity distribution of the detector chip can be shaped by the configuration of the functional layers. This will explained in greater detail in connection with FIGS. 2A to 2C.

For electrical contacting, the detector chip 10 has a first contact 9 and a second contact 12, each of which is made, for example, by metallization. The first contact 9 is preferably placed on the face of the active region 5 facing away from the semiconductor chip, preferably as a contact applied to the semiconductor body 1. The second contact is preferably placed on the face of the active region 5 facing the semiconductor chip 20, preferably between the semiconductor body 1, in particular the carrier 2, and the connecting layer 21. The first and second contacts are electrically connected to the active region 5, so that a signal generated in the active region can easily be detected and fed to the semiconductor chip 20.

The semiconductor chip 20, for example, is designed as an IC chip based on Si for processing the signal generated in the detector chip 10. An amplifier circuit integrated in the semiconductor chip 20, particularly a logarithmic amplifier circuit, which preferably does not change the basic signal curve of the signal generated in the detector chip 10, is particularly suitable for processing the detector signal because of the usually relatively small signal generated in the detector chip 10. A photocurrent generated in the detector chip, preferably designed as a diode chip, is frequently of the order of nA, so that amplification of this signal is useful for further utilization of the signal.

The semiconductor chip 20 preferably has a base 22, for example made of Si, into which the circuit can be integrated. The semiconductor chip 20 also has an input 23, above which the detector chip 10 is preferably placed. The input 23 is preferably developed as a region developed in the base 22, for example by implanting a dopant.

An electrical input contact 24 electrically connected to the input 23 of the semiconductor chip 20, for example metallization, is preferably placed at the input 23 of the semiconductor chip 20. The connecting layer 21 is preferably electrically conductive, and with special preference it is electrically connected to the input contact. The detector chip 10 is electrically connected to the input of the semiconductor chip by means of the connecting layer 21, that is placed between the input 23 and the active region 5 of the detector chip 10. The detector chip 10 is preferably fastened at the same time to the semiconductor chip 20 by means of the connecting layer 21. For this purpose, the connecting layer 21 is preferably designed as an electrically conductive, adhesion-promoting layer, for example a conductive adhesive layer, in particular a silver conductive adhesive layer.

The detector chip 10 is preferably electrically connected directly to the semiconductor chip 20 through the connecting layer 21. The input contact 24 and/or the second contact 12 can optionally be omitted.

A signal generated in the detector chip 10 is fed from the input 23 of the active region 5 through the first semiconductor layer 3, the preferably electrically conductive carrier 2, and the second contact 12. Because of the superimposed arrangement of the detector chip 10 and the semiconductor chip 20, and the layered electrically conductive connection by means of the connecting layer 21 between the chips, the electrically conductive link can be advantageously short. The connecting layer 21 preferably has a thickness between 5 µm and 10 µm inclusive. Accordingly, it is advantageous for the link also to have a length in this range. The risk of electromagnetic effects being coupled in, or of the occurrence of interference currents in the detector system 100 induced by electromagnetic radiation that could perturb the signal of the detector chip before it input to the semiconductor chip 20, can be reduced in this way by reliable fastening. This is particularly important if the detector system is intended for use at a location with relatively high electromagnetic load, for example in a mobile telephone.

The first contact of the detector chip 10 facing away from the semiconductor chip 20 can be made or provided for grounding by means of a bond wire, so that the input 23 of the semiconductor chip 20 is efficiently shielded against electromagnetic interference being coupled into the detector system by grounding the detector chip 10 on its face facing away from the semiconductor chip 20.

The detector system 100, with a detector chip 10 whose sensitivity is designed in accordance with the sensitivity distribution of the human eye, is particularly suitable as an ambient light sensor that can provide a relatively high power and output signal because of the amplification in the semiconductor chip (no output of the semiconductor chip 20 is explicitly illustrated in FIG. 1). Such an ambient light sensor can be used for especially precise brightness control of an illumination or indicator device according to changes in the ambient light, for example in mobile telephones or in the instrument panel of a vehicle.

A detector chip 10 based on Si, optionally with one or a plurality of preceding external filters to match the sensitivity, can optionally be fastened to the to the semiconductor chip 20 through the connecting layer, and can accordingly be electrically connected to the semiconductor chip. However, a detector chip based on III-V semiconductors is particularly suitable for the visible spectral range.

A first primary surface 25 of the semiconductor chip 20 facing the detector chip 10 preferably has a larger surface area than a primary surface 13 of the detector chip facing the semiconductor chip 20. This facilitates stable positioning of the detector chip 10 on the semiconductor chip 20. A subsurface of the semiconductor chip 20, preferably a surface at least partially covering the input 23, can be provided for fastening the detector chip 10. For example, this surface is defined by the surface of the input contact 24 facing away from the base 22. The surface area of this surface is preferably larger than that of the primary surface 13 of the detector chip 10. A second primary surface 26 of the semiconductor chip 10 facing away from the detector chip 10 is preferably intended as a mounting surface for mounting the detector system 100 on a carrier element. In this case, a surface facing the carrier element is to be viewed in particular as a mounting surface for the detector system.

The detector system 100 can also be designed to be especially compact, for example with a height H of 400 μm or less, because of the stacked arrangement of the detector chip and the semiconductor chip. The lateral space requirement of such a detector system is reduced in comparison with that of a detection system with two chips laterally spaced apart from one another.

FIG. 2 shows two examples of embodiment of a detector chap in schematic cross-sectional views in FIGS. 2A and 2B, and in FIG. 2C it shows the curve of the spectral sensitivity distributions of the two detector chips and the curve of the spectral sensitivity distribution of the brightness-adapted human eye.

Such detector chips are particularly suitable for a detector system according to FIG. 1, because the spectral sensitivity distribution of the detector chips can be shaped readily in accordance with a prescribed spectral sensitivity distribution.

According to the examples of embodiment in FIGS. 2A and 2B, the detector chip 10 comprises a semiconductor body 1 that is preferably placed on a carrier 2. The semiconductor body has functional layers 4a, 4b, 4c, and 4d with different band gaps and/or thickness that essentially constitute the active region 5 of the semiconductor body and serve to generate the detector signal. Two, and in particular any, functional layers have different band gaps, and with special preference, different thicknesses. The active region 5 is positioned between an n-conducting semiconductor layer 3, which preferably faces the carrier, and a p-conducting semiconductor layer 6. A filter layer structure 70 with at least one filter layer is positioned between a radiation input surface area 11 of the detector chip 10 and especially of the semiconductor body 1, preferably facing away from the carrier, and the active region 5.

The semiconductor body with the filter layer structure, the n- and p-conducting semiconductor layers, and the functional layers preferably of intrinsic design, is preferably of monolithically integrated design. It is especially preferred for the carrier 2 to comprise the growth substrate on which the layers for the semiconductor body are grown epitaxially, for example by MOVPE, or to consist of the growth substrate.

The n- and p-conductive semiconductor layers 3, 6 are preferably so highly doped that an extensive space charge zone is developed that extends from the p-conductive to the n-conductive semiconductor layer. The functional layers 4a, 4b, 4c, and 4d are preferably located within this space charge zone. Such a space charge zone can have a vertical extent of 1100 nm, preferably 1200 nm or more, for example, depending on the concentration of dopants in the semiconductor layers 3, 6.

Depending on the precise formation—particularly with regard to the particular band gaps—the functional layers can absorb definite wavelengths from radiation 8 entering the semiconductor body 1. Electron-hole pairs are generated with the absorption, which contribute to the signal of the detector chip, for example to the photocurrent or to variables dependent thereon, if they are generated in the space charge zone. The strength of the photocurrent depending on the wavelength of the incident radiation determines the sensitivity of the detector chip with the semiconductor body as the radiation-detecting element.

The spectral sensitivity of the semiconductor body and also that of the detector chip can be matched to a prescribed spectral sensitivity distribution, which preferably has a maximum at a prescribed wavelength $\lambda_0$, by the formation of the filter layer structure 70 and the formation of the functional layers 4a, 4b, 4c, and 4d.

The filter layer structure 70 preferably accomplishes the matching of the detector sensitivity to the prescribed sensitivity by absorbing fractions of the incident radiation with wavelengths smaller than $\lambda_0$. Radiation with wavelengths smaller than $\lambda_0$ thus strikes the active region only with reduced intensity. The signal generated in this wavelength range is consequently matched to the prescribed sensitivity distribution by the absorption in the filter layer structure.

The electron-hole pairs generated by absorption of radiation in the filter layer structure preferably do not contribute essentially to the signal. For this purpose the filter layer structure is suitably placed outside of the active region 5, in particular outside of the space charge zone. A direct or indirect band gap of the particular filter layer can correspond to a wavelength smaller than $\lambda_0$.

It is preferred for the filter layer structure 70 to be doped, and/or to have the same type of conduction as the semiconductor layer 6.

The wavelength to be absorbed, or the wavelength range to be absorbed, in the particular functional layer can be adjusted by the band gaps of the functional layers. The thickness of the functional layer determines the fraction of absorbed radiation power and thus the contribution to the signal generated in the particular functional layer. It is preferred for the semiconductor body 1 to be so aligned that the radiation 8 incident upon the semiconductor body 1 for the most part strikes the detector chip 10 at the radiation entry surface 11.

The functional layers are preferably designed at least in part by suitable choice of a direct band gap so that radiation with wavelengths greater than $\lambda_0$ is absorbed. The long-wavelength side of the sensitivity distribution for wavelengths greater than $\lambda_0$ can thereby be matched to the prescribed sensitivity distribution. In particular, the signal can be generated according to the curve of the prescribed spectral sensitivity distribution, particularly for wavelengths greater than $\lambda_0$, by suitable design of the functional layers.

The band gaps of the functional layers, at least in part, also preferably correspond to wavelengths greater than $\lambda_0$. A plurality of the functional layers preferably have a band gap that corresponds to a wavelength greater than $\lambda_0$. This can facilitate matching the detector sensitive to the prescribed sensitivity on the short-wavelength side (smaller than $\lambda_0$), since this is then determined essentially only by the filter layer structure and thus the effort made to match functional layers and the filter layer structure to one another can be reduced.

The matching of the detector sensitivity to the prescribed sensitivity distribution is beneficially facilitated by placing the filter layer structure outside of the space charge zone, since the filter layer structure is decoupled from the functional layers. This reduces the risk of an interfering influence of electron-hole pairs generated in the filter layer on the detector signal that is generated in the region of the functional layers in accordance with the prescribed spectral sensitivity distribution. The signal critical for the sensitivity of the detector chip is preferably generated essentially in the active region.

Such a semiconductor body permits shaping the sensitivity of the detector chip in accordance with the prescribed spectral sensitivity distribution by the positioning and configuration of the filter layer structure and of the active region. With regard to the functional layers, this is preferably true for the long-wavelength side of detector sensitivity, while the filter layer structure preferably determines the short-wavelength side of detector sensitivity in accordance with the prescribed sensitivity distribution.

The detector chip can be produced simply and is very space-saving. No additional external filters or filter particles are needed to match to the prescribed sensitivity.

The number of functional layers is preferably governed by the spectral width of the prescribed sensitivity distribution. The wider the distribution, the greater the number of functional layers. It is been found that a system of four different functional layers in a heterostructure is often very suitable for matching the generated signal to a prescribed spectral sensitivity distribution, particularly that of the human eye.

The detector chip 16 can be provided with electrical contacts—for example metallizations placed on the semiconductor body—to be able to further process the signal generated in the semiconductor body. The contacts can be positioned on various faces of the semiconductor body. If the contacts are placed on different faces of the carrier (for example see the contacts 9 and 12 of the detector chip 10 in FIG. 1), the carrier is preferably appropriately doped to increase its conductivity.

An active region 5 or a semiconductor body 1 that is based on III-V compound semiconductor materials is especially suitable for matching the sensitivity of the detector chip 10 to a prescribed spectral sensitivity distribution, especially in the visible spectral range, since particularly high quantum efficiencies and band gaps that are suitable for a broad wavelength range can be realized with III-V semiconductor materials.

In another preferred embodiment of the detector chip, its sensitivity has a maximum at a wavelength $\lambda_D$ that preferably differs by 20 nm and with special preference by 10 nm or less, from the wavelength $\lambda_0$ of the maximum of the prescribed spectral sensitivity distribution.

In a preferred embodiment of the detector chip 10, it is designed to detect radiation in accordance with the sensitivity distribution of the human eye. Eye sensitivity has a sensitivity maximum at $\lambda_0 \approx 555$ nm (brightness-adapted, daylight) or at $\lambda_0 \approx 500$ nm (darkness-adapted, night vision).

The prescribed spectral sensitivity distribution, particularly that of the human eye, is frequently specified as having a value of 1 or 100% at the wavelength $\lambda_0$. The sensitivity of the detector chip, which depends on the signal strength, is frequently specified by its responsiveness, i.e. amperes of generated photocurrent per watt of incident radiant power.

To compare the detector sensitivity with the prescribed spectral sensitivity distribution, it is therefore expedient to match the two sensitivities to one another so that the prescribed sensitivity distribution at $\lambda_0$ and the detector sensitivity at $\lambda_D$ have the value of 100% (relative sensitivities). The present description relates to relative sensitivities if not otherwise indicated.

The semiconductor body is preferably made so that at any given wavelength, the difference between the relative values of detector sensitivity and prescribed sensitivity distribution is less than 20%, and most preferably less than 15%.

For a detector chip according to eye sensitivity, in particular that of the brightness-adapted human eye, the semiconductor body 1 is preferably based on the III-V semiconductor material systems $In_xGa_yAl_{1-x-y}P$ and/or $In_xGa_yAl_{1-x-y}As$. The functional layers 4a, 4b, 4c, and 4d are preferably made of these material systems, especially of the material system $In_xGa_yAl_{1-x-y}P$, preferably with $x \neq 0$ and/or $y \neq 0$. The band gaps can be set by varying the Al content, and higher Al content may correspond to larger band gaps. This is true at least for Al contents that form direct semiconductors for the specified semiconductor material systems that are preferred for making the functional layers. It is especially preferred for the semiconductor body to be based on $In_{0.5}(Ga_{1-x}Al_x)_{0.5}P$ and/or $Al_xGa_{1-x}As$, which are well lattice-matched to one another and also to a GaAs growth substrate.

In the example of embodiment according to FIG. 2A, the filter layer structure 70 comprises a single filter layer 7.

The filter layer 7 determines the curve of the short-wavelength side of the detector sensitivity, preferably by the absorption of wavelengths smaller than $\lambda_0$ by an indirect band gap. To this end, the filter layer is expediently made with appropriate thickness.

A direct band gap of the filter layer preferably determines a short-wavelength limiting wavelength of detector sensitivity. For wavelengths smaller than the short-wavelength limit, the detector sensitivity disappears or is negligible.

The filter layer 7 in a semiconductor body in accordance with eye sensitivity is preferably made from $Al_xGa_{1-x}As$ ($0 \leq x \leq 1$) or GaP. Semiconductor bodies can advantageously be produced with the mentioned functional materials and filter layer materials with monolithic integration.

The materials mentioned for the filter layer can have a direct band gap and an indirect band gap, with the direct band gap preferably corresponding to a wavelength smaller than $\lambda_0$, which very preferably determines the short-wavelength limit of detector sensitivity.

GaP, for example, has a direct band gap ($E_G \approx 2.73$ eV) that corresponds to a wavelength of about 455 nm, while the direct band gap ($E_G \approx 2.53$ eV) of $Al_{0.8}Ga_{0.2}As$, which can be used for a filter layer, corresponds to about 490 nm. The absorption of incident radiation by the indirect band gap preferably determines the short-wavelength side of detector sensitivity for wavelengths smaller than $\lambda_0$. The fraction of radiant power absorbed by the indirect band gap can be controlled through the thickness of the filter layer.

A detector chip 10 having the following elements that has a filter layer structure with a single filter layer 7 according to FIG. 2A is especially suitable for a detector chip 10 with a spectral sensitive distribution in accordance with that of the human brightness-adapted eye:

The semiconductor body based on $In_xGa_yAl_{1-x-y}P$ is grown epitaxially on a carrier 2 made of n-GaAs, which serves as the growth substrate, for example by an MOVPE method. A highly doped ($n^+$) n-conductive semiconductor layer 3 of $In_{0.5}Al_{0.5}P$ about 100 nm thick is first grown on the carrier 2 containing GaAs. The active region 5 is then produced, which comprises essentially undoped functional layers 4a ($In_{0.5}Ga_{0.5}P$, thickness $\approx 50$ nm, $E_G \approx 1.91$ eV, $\lambda_G \approx 650$ nm), 4b ($In_{0.5}(Ga_{0.9}Al_{0.1})_{0.5}P$, thickness $\approx 100$ nm, $E_G \approx 1.97$ eV, $\lambda_G \approx 630$ nm), 4c ($In_{0.5}(Ga_{0.7}Al_{0.3})_{0.5}P$, thickness $\approx 400$ nm, $E_G \approx 2.07$ eV, $\lambda_G \approx 600$ nm), and 4d ($In_{0.5}(Ga_{0.5}Al_{0.5})_{0.5}P$, thickness $\approx 500$ nm, $E_G \approx 2.20$ eV, $\lambda_G \approx 565$ nm). $E_G$ here designates the band gap, particularly the direct band gap, of the particular material that is critical for the absorption, and $\lambda_G$ is the wavelength corresponding to this band gap. Then an approximately 100-nm thick, p-conductive highly doped ($p^+$) $In_{0.5}Al_{0.5}P$ layer 6 is produced, followed by an approximately 15-μm thick p-GaP filter layer 7. The space charge zone brought about by the n-conductive 3 and the p-conductive semiconductor layer 6 extends through the functional layers. The filter layer 7 is positioned outside of the space charge zone.

However, such a semiconductor body 1, with a filter layer 7 that is 15 μm thick, is relatively thick for a detector chip.

The spectral sensitivity distribution 102a of a detector chip 10 designed according to the discussions above is illustrated quantitatively in FIG. 2C, based on the eye sensitivity 103 in accordance with the V(λ) curve of the CIE (International Illumination Commission). The sensitivity distribution of a detector chip 10 with a semiconductor body made according to the above discussions was measured for this.

The maximum of eye sensitivity $\lambda_0$ and of detector sensitivity $\lambda_{D,a}$ nearly coincide, with $\lambda_{D,a}$ being slightly larger than $\lambda_0$. The difference between these wavelengths is preferably 10 nm, and especially 5 nm, or less. The short-wavelength side 105a of the detector sensitivity 102a is determined by the filter layer 7. The detector sensitivity below a limiting wavelength $\lambda_1$ ($\approx 455$-465 nm) is nearly zero. This limiting wavelength corresponds approximately to the direct band gap ($E_G \approx 2.73$ eV) of GaP. For wavelengths larger than $\lambda_1$, the filter layer 7 determines the curve of the short-wavelength side of detector sensitivity by absorption by its indirect band gap. Since GaP has a relatively flat absorption edge, the filter layer is made relatively thick, 15 μm, to produce the matching of detector sensitivity to the prescribed sensitivity distribution in the wavelength range smaller than $\lambda_0$.

The long-wavelength side 106a of the detector sensitivity is determined by the configuration of the functional layers. For the wavelength range from about 550 to about 620 nm, in which the detector sensitivity and the prescribed sensitivity have high values, the corresponding functional layers 4d and 4c, as described above, are relatively thick, with 500 nm and 400 nm, respectively, so that a correspondingly high photocurrent signal is generated in the radiation detector in this wavelength range. The layer 4b, on the other hand, is made relatively thin, 100 nm, since eye sensitivity is comparatively low for wavelengths in the range greater than approximately 620 nm. Eye sensitivity is very low in the range larger than approximately 640 to 680 nm, particularly up to 700 nm, and the corresponding functional layer 4a is therefore made comparatively thin (50 nm).

In contrast to the detector chip 10 illustrated in FIG. 2A, the filter layer structure 70 in the example of embodiment according to FIG. 2B has a plurality of filter layers 7a, 7b, and 7c, which preferably have different band gaps and/or thicknesses. It is preferred for two, and in particular any, filter layers to have different band gaps and with particular preference different thicknesses. The filter layer structure 70 is preferably made as a continuous compound filter layer.

The p-conductive semiconductor layer 6 can also be designed for filtration, but this is not compulsory. It is preferred for at least one, and with special preference all of the filter layers of the filter layer structure to be highly doped, optionally p-conductive ($p^+$).

Absorption in the filter layers of the filter layer structure occurs essentially through a direct band gap of the particular filter layer. In contrast to the example of embodiment according to FIG. 2A, in which the filtering and in particular the shaping of the detector sensitivity on the short-wavelength side occurs primarily by absorption through the indirect band gap of the single filter layer, the filter layer structure according to FIG. 3 can simply be made comparatively thin, without negatively affecting the match to the prescribed spectral sensitivity distribution. In particular, the total thickness of the filter layer structure 70 amounts to 1 μm or less, preferably 0.9 μm or less.

The production costs for such a semiconductor body drop advantageously with a reduced thickness of the filter layer structure, partly because of reduced times of epitaxy.

The filter layers 7a, 7b, and 7c can each be based on $In_xGa_yAl_{1-x-y}P$ and/or $In_xGa_yAl_{1-x-y}As$, especially $In_{0.5}(Ga_{1-x}Al_x)_{0.5}P$ and/or $Al_xGa_{1-x}As$.

A relatively rapid decline of detector sensitivity in the range of the direct band gap of a thick filter layer can be avoided by a filter layer structure 70 with a plurality of thin filter layers. Detector sensitivity also can thus simply be matched to the prescribed distribution in the range of the direct band gap of a filter layer or in the range of a declining short-wavelength flank of the prescribed spectral sensitivity distribution.

An active region comprising the following elements is especially suitable for a detector chip according to FIG. 2B, which has a filter layer structure 70 with a plurality of filter layers, and a spectral sensitivity distribution in accordance with that of the human brightness-adapted eye: functional layer 4a ($In_{0.5}Ga_{0.5}P$, thickness $\approx 50$ nm, $E_G \approx 1.91$ eV, $\lambda_G \approx 650$ nm), functional layer 4b ($In_{0.5}(Ga_{0.9}Al_{0.1})_{0.5}P$, thickness $\approx 100$ nm, $E_G \approx 1.97$ eV, $\lambda_G \approx 630$ nm), functional layer 4c ($In_{0.5}(Ga_{0.7}Al_{0.3})_{0.5}P$, thickness $\approx 300$ nm, $E_G \approx 2.07$ eV, $\lambda_G \approx 600$ nm), and functional layer 4d ($In_{0.5}(Ga_{0.5}Al_{0.5})_{0.5}P$, thickness $\approx 700$ nm, $E_G \approx 2.20$ eV, $\lambda_G \approx 565$ nm). Differences from the configuration of the semiconductor body in accordance with eye sensitivity from FIG. 2A are found in the thicknesses of the functional layers 4c and 4d, which are made thinner or thicker, respectively, because of the change of the filter layer structure.

Filter layers 7a ($In_{0.5}Al_{0.5}P$, thickness $\approx 400$ nm), 7b ($Al_{0.7}Ga_{0.3}As$, thickness $\approx 250$ nm), and 7c ($Al_{0.8}Ga_{0.2}As$, thickness $\approx 200$ nm) are especially suitable for the filter layer structure 70. If the p-conductive semiconductor layer 6 is developed as filter layer 7a, as illustrated in FIG. 2B, the n-conductive layer 3 ($In_{0.5}Al_{0.5}P$, thickness $\approx 400$ nm) is made with the composition and thickness corresponding to the p-conductive semiconductor layer 6. As a consequence, the thickness of the filter layer structure is approximately 850 nm.

The spectral sensitivity distribution 102b of a detector chip designed in this way is also illustrated in FIG. 2C.

The basic curve of the long-wavelength side 106b of detector sensitivity 102b coincides with that of detector sensitivity 102a. The long-wavelength side 106b runs essentially along the long-wavelength side of the prescribed spectral sensitivity distribution 103 of the human eye. In particular, $\lambda_{D,a} \approx \lambda_{D,b}$.

In contrast to the detector sensitivity 102a, the semiconductor body according to FIG. 2B generates a significant signal for short wavelengths because of the plurality of filter layers that do not determine any sharp lower limiting wavelength compared to the single filter layer according to the curve 102a. Also, for wavelengths smaller than $\lambda_1$, below approximately 460 nm, it is thus readily feasible to match detector sensitivity to the prescribed spectral sensitivity distribution because of the plurality of filter layers 7a, 7b, and 7c. Nevertheless, in FIG. 2C the short-wavelength side 105b of detector sensitivity 102b is readily matched to the prescribed spectral sensitivity distribution 103 even in the range of comparatively small wavelengths, perhaps smaller than 490 nm.

All in all, the matching of detector sensitivity to the prescribed spectral sensitivity distribution can be improved by means of a plurality of filter layers and absorption of radiation fractions essentially by their direct band gaps. At the same time, a beneficially small thickness of the filter layer structure is achieved.

It might be noted that the Al content of the functional layers can differ from the content cited here. Thus, for example, a detector chip in accordance with eye sensitivity can also optionally be realized with functional layers whose Al content differs from the Al content cited above by 10% or less, preferably by 5% or less.

By suitable design of the functional layers and of the filter layer structure, and by tuning them to one another, other detector sensitivities differing from eye sensitivity can also by realized, for example following a prescribed spectral rectangular distribution. Furthermore, the number of functional layers—four functional layers in the example of embodiment—is not to be considered limiting. A number of functional layers different from this can also be provided in a semiconductor body for a detector chip.

Figure 3B:
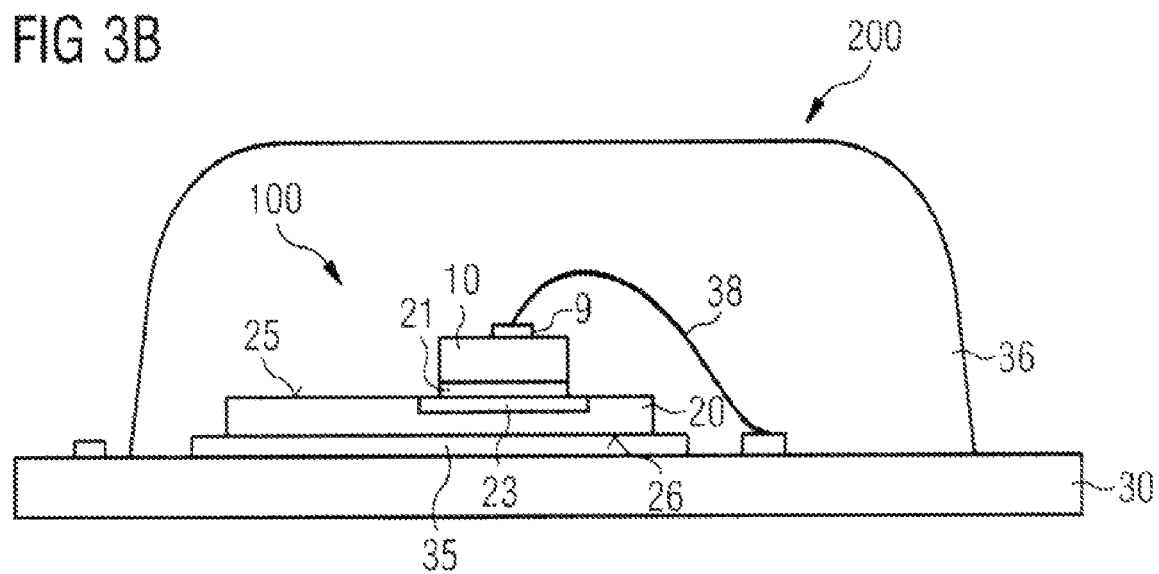

FIG. 3 shows an example of embodiment of a detector subassembly with reference to a schematic top view in FIG. 3A and a schematic cross-sectional view of the detector element in FIG. 3B, along the line A-A in FIG. 3A.

The detector subassembly 200 comprises a detector system 100 that is mounted on a carrier element 30, for example soldered to it. The detector system 100 is preferably made according to the example of embodiment described in FIG. 1 and comprises the optoelectronic detector chip 10 and the microelectronic semiconductor chip 20, which are connected through the connecting layer 21, preferably with mechanical stability and electrical conductivity.

The detector chip is preferably designed in accordance with the discussions for FIG. 2. The semiconductor chip 20 is positioned between the detector chip 10 and the carrier element 30. The detector system 100 is embedded in a clear shell 36 transparent to radiation that is preferably free of filter particles. The shell 36, for example, contains a reactive resin such as an epoxy or acrylic resin, a silicone resin, or a silicone. An epoxy molding compound is especially suitable as material for the shell. The shell protects the detector system and other elements that may be embedded in the shell, preferably against harmful external influences such as mechanical stress.

The detector subassembly 200 also comprises a first external connector 31, a second external connector 32, a third external connector 33, and a fourth external connector 34 for external electrical contacting of the detector system 100. These external connectors of the surface-mountable detector subassembly 200 can be connected electrically to the conducting paths of a printed circuit board (not shown), for example soldered to them. Each of the external connectors is preferably constructed as a connector metallization on the carrier element 30, which preferably contains a plastic.

The detector system 100 is preferably connected by its second principal surface 26 facing away from the detector chip 10 serving as a mounting surface, to a mounting area 35 formed on the carrier element 30, which is composed of a metallization, for example. The first and second external connectors 31 and 32 are preferably connected electrically to one another directly in particular, and/or are provided for grounding during the assembly of the subassembly by laying the connectors at ground potential. The first and second external connectors 31 and 32 can optionally also be made as a single common connector.

The mounting area 35 is preferably connected thermally to the first and second external connectors 31 and 32, so that heat formed in the semiconductor chip 20 can easily be carried off from the semiconductor chip and the external connectors 31 and 32 through the mounting area 35.

A wire grounding area 37, which is made as a metallization, for example, is preferably connected electrically to the first and second external connectors 31, 32, particularly through the mounting area 35, so that the first contact 9 of the detector chip 10 and preferably a grounding contact 43 located on the first principal surface 25 of the semiconductor chip 20 can each be grounded by means of a bond wire 38 or 39, respectively, through the wire grounding area 37. The grounding contact 43 and the first contact 9 for this purpose are electrically connected to the wire grounding area 37 through the bond wires 39 and 38, respectively.

The input 23 of the semiconductor chip 20 is advantageously shielded against electromagnetic ambient interference being coupled in by means of the bond wire 38. Induced interference, for example an interference current, is instead easily carried off beneficially to ground potential in this way instead of into the detector chip or the semiconductor chip.

The electrically conductive layer connection between the detector chip 10 and the semiconductor chip 20 through the connecting layer 21 also reduces the risk of electromagnetic interference coupling into the detector subassembly 200, especially into the detector chip signal generated by the detector chip and fed to the semiconductor chip.

The third external connector 33 is preferably connected electrically to a power supply contact 40 that can be connected electrically to the semiconductor chip 20, for example by means of another bond wire 41. The semiconductor chip 20 in this way can be powered through the third external connector 33 by a supply voltage ($V_{cc}$). The power supply connector 40 is preferably located on the first principal surface 25 of the semiconductor chip 20 and is a metallization, for example.

The signal from the detector chip amplified in the semiconductor chip can be detected through the fourth external connector 34, which is electrically connected preferably to an output contact 42, for example a metallization, of the semiconductor chip 20, for example through another bond wire 44. The output contact 42 is preferably located on the principal surface 25 and electrically connected to the output of the semiconductor chip. The stacked arrangement of the detector chip and the semiconductor chip, in combination with the grounding of the first contact, facilitates reliable detection and further use of the output signal from the detector subassembly, which beneficially has low interference and is not susceptible to interference.

A very space-saving detector subassembly 200, particularly one with a small mounting area, can be constructed because of the stacked arrangement of the detector chip 10 and the semiconductor chip 20 of the detector system 100. A housing for the detector subassembly 200 that can enclose the carrier element 30 and the shell 36, has a small space requirement when mounting the detector subassembly, for example on a printed circuit board. The surface of the carrier element 30 facing away from the detector system is preferably a mounting area of the subassembly. This patent application claims the priorities of German Patent Applications DE 10 2005 047 136.6 dated Sep. 30, 2005, and DE 10 2005 061206.7 dated Dec. 21, 2005, the entire disclosure contents of which are hereby explicitly incorporated by back reference in the present patent application.

The invention is not limited by the Specification with reference to the examples of embodiment. Instead, the invention comprises any new feature and any combination of features, particularly including any combination of features in the Patent Claims, even if this feature or this combination is not explicitly specified in the Patent Claims or examples of embodiment.

The invention claimed is:

1. A detector system comprising:
   a microelectronic semiconductor chip; and
   a separate optoelectronic detector chip,
   wherein the detector chip is positioned on the semiconductor chip;
   wherein the detector chip is based on a compound semiconductor material or compound semiconductor materials; and
   wherein the detector system is configured for use as an ambient light sensor operable to detect visible ambient light.

2. The detector system pursuant to claim 1, wherein the semiconductor chip is designed to process a signal generated in the detector chip.

3. The detector system pursuant to claim 2, wherein the semiconductor chip is designed as an amplifier to amplify the signal generated in the detector chip.

4. The detector system pursuant to claim 1, wherein the detector chip is based on a III-V compound semiconductor material or III-V compound semiconductor materials.

5. The detector system pursuant to claim 1, wherein the semiconductor chip is based on an elemental semiconductor material.

6. The detector-system pursuant to claim 1, wherein the detector chip (is electrically connected to the semiconductor chip.

7. The detector system pursuant to claim 6, wherein the detector chip is electrically connected to the semiconductor chip through an electrically conductive connecting layer located between the semiconductor chip and the detector chip.

8. The detector-system pursuant to claim 1, wherein the detector chip is positioned on an input of the semiconductor chip.

9. The detector system pursuant to claim 1, wherein the detector chip is fastened to the semiconductor chip.

10. The detector system pursuant to claim 1, wherein the detector chip is joined to the semiconductor chip by means of an adhesive layer.

11. The detector system pursuant to claim 10, wherein the adhesive layer is produced as an electrically conductive connecting layer.

12. The detector system pursuant to claim 1, wherein a face of the detector chip facing away from the semiconductor chip is provided for grounding the detector chip.

13. The detector system pursuant to claim 1, wherein the detector chip has a spectral sensitivity distribution that is shaped in accordance with a prescribed spectral sensitivity distribution.

14. The detector system pursuant to claim 13, wherein the prescribed spectral sensitivity distribution is the sensitivity distribution of the human eye.

15. The detector system pursuant to claim 1, wherein a height of the detector system is less than or equal to 500 µm.

16. The detector system pursuant to claim 1, wherein a surface of the semiconductor chip facing away from the detector chip is provided as a mounting surface for mounting the detector system on a carrier element.

17. The detector system pursuant to claim 1, wherein a surface of the semiconductor chip facing the detector chip is larger than a surface of the detector chip facing the semiconductor chip.

18. A detector subassembly with a detector system pursuant to claim 1 mounted on a carrier element.

19. The detector subassembly pursuant to claim 18, wherein the semiconductor chip is positioned between the detector chip and the carrier element.

20. The detector subassembly pursuant to claim 18, wherein the detector system is embedded in a shell transparent to radiation.

21. The detector subassembly pursuant to claim 18, which is designed as a surface-mountable detector subassembly.

* * * * *

UNITED STATES PATENT AND TRADEMARK OFFICE
CERTIFICATE OF CORRECTION

PATENT NO. : 8,030,685 B2  
APPLICATION NO. : 12/064759  
DATED : October 4, 2011  
INVENTOR(S) : Thomas Hoefer et al.

Page 1 of 1

It is certified that error appears in the above-identified patent and that said Letters Patent is hereby corrected as shown below:

In Claim 6, Column 17, line 30, delete "detector-system" insert -- detector system --.

In Claim 6, Column 17, line 31, delete "(is" insert -- is --.

In Claim 8, Column 17, line 38, delete "detector-system" insert -- detector system --.

Signed and Sealed this  
Twenty-ninth Day of November, 2011

David J. Kappos  
*Director of the United States Patent and Trademark Office*